United States Patent
Kao et al.

(10) Patent No.: US 10,218,367 B2
(45) Date of Patent: Feb. 26, 2019

(54) FREQUENCY SYNTHESIZING DEVICE AND AUTOMATIC CALIBRATION METHOD THEREOF

(71) Applicant: Raydium Semiconductor Corporation, Hsinchu (TW)

(72) Inventors: Jung-Sui Kao, Zhubei (TW); Jri Lee, Taipei (TW); Li-Yang Chen, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 15/587,448

(22) Filed: May 5, 2017

(65) Prior Publication Data

US 2017/0324418 A1   Nov. 9, 2017

(30) Foreign Application Priority Data

May 6, 2016 (TW) .............................. 105114170 A

(51) Int. Cl.
*H03B 21/00* (2006.01)
*H03L 7/18* (2006.01)
*H03L 7/089* (2006.01)

(52) U.S. Cl.
CPC .............. *H03L 7/18* (2013.01); *H03L 7/0891* (2013.01)

(58) Field of Classification Search
None
See application file for complete search history.

(56) References Cited

U.S. PATENT DOCUMENTS

| | | | | |
|---|---|---|---|---|
| 6,710,664 B2 * | 3/2004 | Humphreys | ............ | H03L 7/087 331/11 |
| 7,804,367 B2 * | 9/2010 | Lee | .......................... | H03L 7/087 327/156 |
| 2003/0197564 A1 * | 10/2003 | Humphreys | ............ | H03L 7/087 331/11 |
| 2008/0106340 A1 * | 5/2008 | Lee | .......................... | H03L 7/087 331/16 |
| 2008/0157884 A1 * | 7/2008 | Lee | .......................... | H03L 7/113 331/44 |

* cited by examiner

*Primary Examiner* — Long Nguyen

(57) ABSTRACT

A frequency synthesizing device includes a voltage-controlled oscillator receiving an adjusting signal and generating an output signal according to the adjusting signal. A feedback frequency divider having a plurality of divisor values receives the output signal and generates a feedback signal after performing frequency dividing. An automatic frequency calibration circuit of the frequency synthesizing device includes a first frequency divider receiving a reference frequency, and a second frequency divider receiving the feedback signal. A comparator of the automatic frequency calibration circuit receives and compares outputs from the first frequency divider and the second frequency divider in a predetermined period to generate a comparing result. A state machine outputs the adjusting signal according to the comparing result in a calibration mode.

8 Claims, 4 Drawing Sheets

FREQUENCY SYNTHESIZING DEVICE AND AUTOMATIC CALIBRATION METHOD THEREOF

BACKGROUND OF THE INVENTION

1. Field of the Invention

The present invention relates to a frequency synthesizing device and a method; particularly, the present invention relates to a frequency synthesizing device and an automatic calibration method utilized in the frequency synthesizing device.

2. Description of the Prior Art

Frequency synthesizing devices are widely used in a variety of electronic devices. A voltage-controlled oscillator of the frequency synthesizing device is usually designed to have multiple working bands in a range of application frequencies. The traditional frequency synthesizing device has several different methods to lock the working band. For example, the voltage-controlled oscillator is set to operate in two different working bands in sequence to obtain two different operation frequencies by using an accumulator. Then the two operation frequencies are computed by a control unit to obtain a differential value between the two operation frequencies and differential values between a reference frequency and the two operation frequencies. Finally, a desired working band is selected.

However, the aforementioned method requires each working band of the voltage-controlled oscillator having evenly linear distribution or the working band selection may have an error. Generally speaking, the aforementioned method still needs much time to lock frequency. Therefore, the structure of the traditional frequency synthesizing device and the method for frequency calibration need to be improved.

SUMMARY OF THE INVENTION

It is an object of the present invention to provide a frequency synthesizing device improving frequency calibration efficiency.

It is another object of the present invention to provide an automatic calibration method simplifying the process of frequency calibration.

A frequency synthesizing device includes a voltage-controlled oscillator receiving an adjusting signal and generating an output signal according to the adjusting signal. A feedback frequency divider having a plurality of divisor values receives the output signal and generates a feedback signal after performing frequency dividing. An automatic frequency calibration circuit of the frequency synthesizing device includes a first frequency divider receiving a reference frequency, and a second frequency divider receiving the feedback signal. A comparator of the automatic frequency calibration circuit receives and compares outputs from the first frequency divider and the second frequency divider in a predetermined period to generate a comparing result. A state machine outputs the adjusting signal according to the comparing result in a calibration mode.

An automatic calibration method includes the following steps: setting a control voltage of the voltage-controlled oscillator as a reference voltage in a coarse adjusting mode; setting the feedback frequency divider to generate the feedback signal by using a first divisor value selected from the plurality of divisor values; receiving a reference frequency and generating a frequency dividing reference frequency; receiving the feedback signal and generating a frequency dividing feedback signal; comparing the frequency dividing feedback signal with the frequency dividing reference frequency to generate a comparing result; setting the feedback frequency divider to generate the feedback signal by using a second divisor value when the comparing result shows a phase of the frequency dividing feedback signal falling behind a phase of the frequency dividing reference frequency.

DETAILED DESCRIPTION OF THE PREFERRED EMBODIMENT

Figure 1:
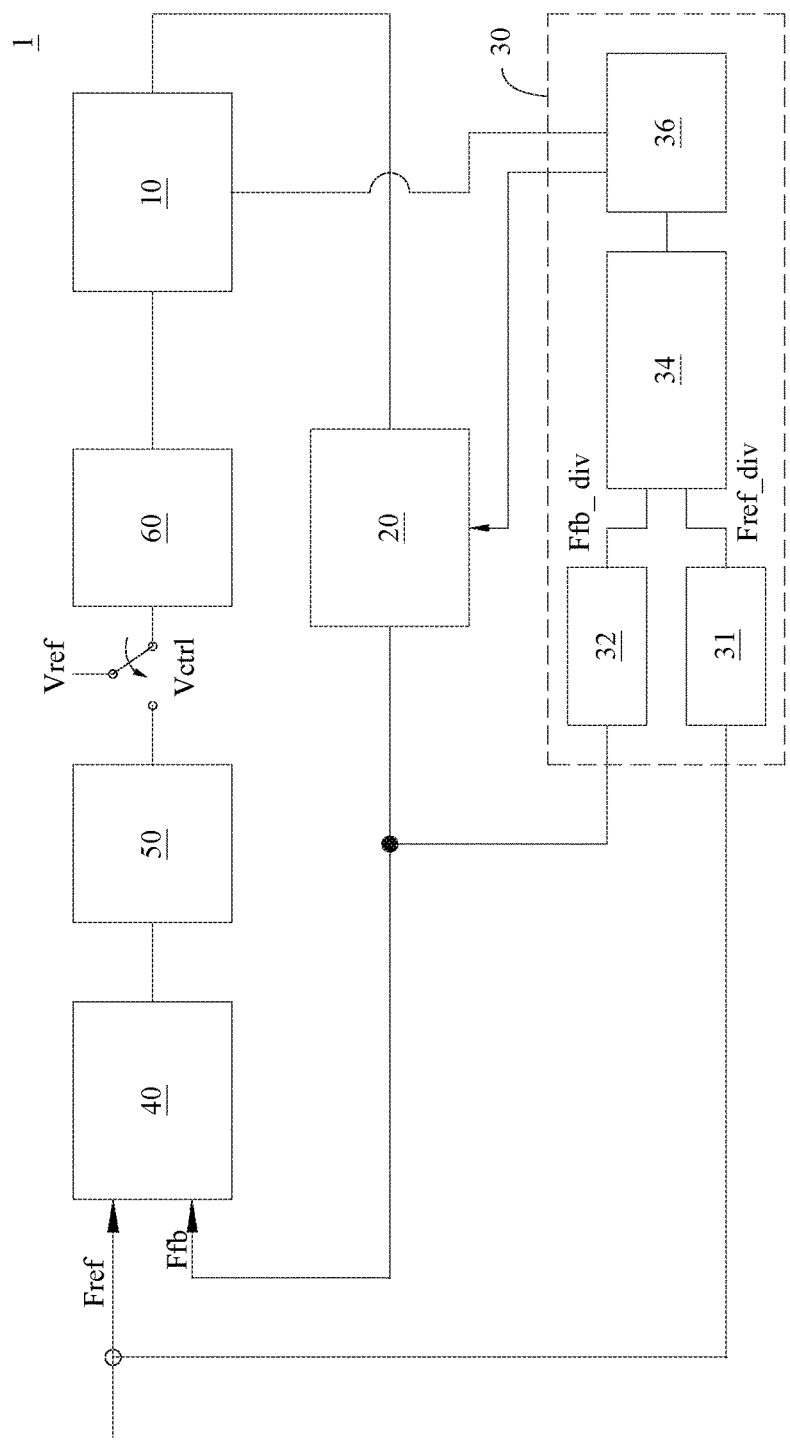
FIG. 1 is a schematic view of an embodiment of a frequency synthesizing device of the present invention.

The present invention provides a frequency synthesizing device. FIG. 1 is a schematic view of an embodiment of the frequency synthesizing device 1 of the present invention. As shown in FIG. 1, the frequency synthesizing device 1 includes a voltage-controlled oscillator 10, a feedback frequency divider 20, an automatic frequency calibration circuit 30, a phase frequency detector 40, a charge pump 50, and a filter 60.

The voltage-controlled oscillator 10 selects, according to an adjusting signal transmitted from the automatic frequency calibration circuit 30, a band from multiple working bands of the voltage-controlled oscillator 10 to generate an output signal. The voltage-controlled oscillator 10 is coupled to the feedback frequency divider 20. The feedback frequency divider 20 receives the output signal from the voltage-controlled oscillator 10 and generates a feedback signal after performing frequency dividing. The feedback frequency divider 20 is coupled to the automatic frequency calibration circuit 30. The automatic frequency calibration circuit 30 receives the feedback signal and a reference frequency to decide whether or not to modify the selected working band.

A calibration mode can be divided into two stages: one is a coarse adjusting mode, and the other is a fine adjusting mode. As shown in FIG. 1, in the coarse adjusting mode, the switch between the filter 60 and the charge pump 50 is connected to a reference voltage (Vref), i.e. a control voltage of the voltage-controlled oscillator 10 is set to the reference voltage (Vref). The path along the phase frequency detector 40, the charge pump 50, and the filter 60 is formed as an open loop. The reference voltage (Vref) is provided to the voltage-controlled oscillator 10 via the filter 60, and a working band is selected according to the adjusting signal transmitted by the automatic frequency calibration circuit 30 so as to generate the output signal.

On the other hand, the frequency synthesizing device 1 utilizes the automatic frequency calibration circuit 30 to determine locking criteria. The automatic frequency calibration circuit 30 selects a divisor value from a plurality of divisor values of the feedback frequency divider 20. The feedback frequency divider 20 receives the output signal and generates the feedback signal according to the selected divisor value after performing frequency dividing. The plurality of divisor values is integer. For example, the feedback frequency divider is set to have divisor values, such as 1, 2, 4, and 8. In other embodiment, divisor values can be fractional numbers.

It is noted that the order of the divisor values of the feedback frequency divider 20 is selected from the larger one to the smaller one. For example, at first, "the divisor value=8" is selected as a first divisor value, and then "the divisor value=4" is selected as a second divisor value.

Besides, as shown in FIG. 1, the automatic frequency calibration circuit 30 includes a first frequency divider 31, a second frequency divider 32, a comparator 34, and a state machine 36. The first frequency divider 31 receives the reference frequency, and the second frequency divider 32 receives the feedback signal. The comparator 34 receives and compares outputs from the first frequency divider 31 and the second frequency divider 32 in a predetermined period to generate a comparing result. The state machine 36 outputs the adjusting signal according to the comparing result in a calibration mode.

As mentioned above, the frequency synthesizing device 1 utilizes the automatic frequency calibration circuit 30 to determine locking criteria. In the coarse adjusting mode, the automatic frequency calibration circuit 30 sets the first frequency divider 31 to perform frequency dividing on the reference frequency to generate a frequency dividing reference frequency, and sets the second frequency divider 32 to perform frequency dividing on the feedback signal to generate a frequency dividing feedback signal. On the other hand, as mentioned above, the state machine 36 sets the feedback frequency divider 20 to generate the feedback signal by using the first divisor value selected from the plurality of divisor values, and then the feedback signal is outputted to the second frequency divider 32.

The frequency dividing reference frequency (Fref_div) and the frequency dividing feedback signal (Ffb_div) are compared in the comparator 34. In an embodiment, the signal phase is utilized to determine whether the locking criteria is satisfied, i.e. in the predetermined period, the phase of the frequency dividing reference frequency (Fref_div) and the phase of the frequency dividing feedback signal (Ffb_div) are compared. When the comparing result shows that the phase of the frequency dividing feedback signal (Ffb_div) falls behind the phase of the frequency dividing reference frequency (Fref_div), the locking criteria is not satisfied, and the state machine 36 sets the feedback frequency divider 20 to generate another feedback signal by using the second divisor value (for example: the divisor value=4) selected from the plurality of divisor values different from the first divisor value. In contrast, when the comparing result shows that the phase of the frequency dividing feedback signal (Ffb_div) leads the phase of the frequency dividing reference frequency (Fref_div), the locking criteria is satisfied, and the state machine 36 sets the feedback frequency divider 20 to use the same divisor value and finishes the coarse adjusting mode.

In an embodiment, in the coarse adjusting mode, the aforementioned divisor value of the second frequency divider 32 is set to be smaller than the divisor value of the first frequency divider 31. For example, the divisor value of the second frequency divider 32 is set to be half of the divisor value of the first frequency divider 31. In other words, in the coarse adjusting mode, the automatic frequency calibration circuit 30 utilizes the divisor value of the feedback frequency divider 20 and another divisor value smaller than the divisor value used for the first frequency divider 31 as the initial locking criteria. The comparator 34 determines whether the comparing result satisfies the initial locking criteria in the coarse adjusting mode in order to decide whether to enter the fine adjusting mode. By this design, the divisor value of the feedback frequency divider 20 can be changed immediately when the phase of the frequency dividing feedback signal (Ffb_div) falls behind the phase of the frequency dividing reference frequency. As such, the feedback signal can fast track the reference frequency.

When the coarse adjusting mode is finished, the feedback frequency divider 20 is set to use the same divisor value, and the switch is connected to the charge pump 50 (see FIG. 1) to turn on the path along the phase frequency detector 40, the charge pump 50, and the filter 60. The frequency locking of the reference frequency (Fref) and the feedback signal (Ffb) is performed in the loop formed by the phase frequency detector 40, the charge pump 50, the filter 60, the voltage-controlled oscillator 10, and the feedback frequency divider 20.

In the fine adjusting mode, the automatic frequency calibration circuit 30 sets the divisor value of the second frequency divider 32 to be equal to the divisor value of the first frequency divider 31. In other words, in the fine adjusting mode, the automatic frequency calibration circuit 30 changes the relationship between the divisor value of the first frequency divider 31 and the divisor value of the second frequency divider 32, and adopts the divisor value of the feedback frequency divider 20 confirmed during the coarse adjusting mode as the new locking criteria. In the fine adjusting mode, the comparator 34 determines whether the new locking criteria is satisfied based on the comparison of the signal phase in order to determine whether the calibration is finished. When the comparing result shows that the phase of the frequency dividing feedback signal (Ffb_div) falls behind the phase of the frequency dividing reference frequency (Fref_div), the new locking criteria is not satisfied, and the state machine 36 outputs the adjusting signal to change the input signal and the working band of the voltage-controlled oscillator 10, i.e. in the fine adjusting mode, the working band of the voltage-controlled oscillator 10 is controlled by current. Next, when the comparing result shows that the phase of the frequency dividing feedback signal (Ffb_div) leads the phase of the frequency dividing reference frequency (Fref_div), the new locking criteria is satisfied, and the fine adjusting mode is finished. After performing the fine adjusting mode, the frequency synthesizing device 1 operates in a frequency-locking status.

Figure 2:
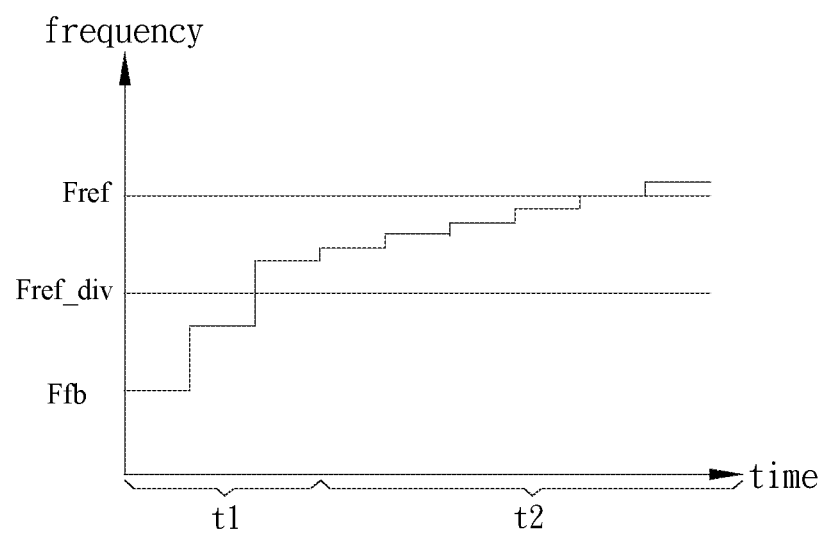
FIG. 2 is a schematic view of a calibration process performed by the frequency synthesizing device.

FIG. 2 is a schematic view of a calibration process performed by the frequency synthesizing device. As shown in FIG. 2, the frequency-time relation diagram illustrates the reference frequency (Fref), the feedback signal (Ffb), and the frequency dividing reference frequency (Fref_div) set by the automatic frequency calibration circuit. The feedback signal (Ffb) has several horizontal line segments representing different feedback signals generated by selecting different divisor values in the feedback frequency divider.

As mentioned above, the comparator compares the phase of the frequency dividing feedback signal (Ffb_div) with the phase of the frequency dividing reference frequency (Fref_div) to determine whether the locking criteria is satisfied. As shown in FIG. 2, the coarse adjusting mode is performed within time period (t1). When the comparator gets the comparing result showing that the phase of the frequency dividing feedback signal (Ffb_div, see FIG. 1) falls behind the phase of the frequency dividing reference frequency (Fref_div), the state machine 36 outputs the adjusting signal to change the divisor value of the feedback frequency divider 20, so that the feedback signal (Ffb) can gradually track the frequency dividing reference frequency (Fref_div) (and track the reference frequency (Fref)) within time period (t1). When the comparator gets the frequency dividing feedback signal (Ffb_div, see FIG. 1) transmitted at faster rate than the frequency dividing reference frequency (Fref_div), and gets the comparing result showing that the phase of the frequency dividing feedback signal (Ffb_div) leads the phase of the frequency dividing reference frequency (Fref_div), the coarse adjusting mode is finished.

Next, as shown in FIG. 2, the fine adjusting mode is performed within time period (t2). When the comparator gets the comparing result showing that the phase of the frequency dividing feedback signal (Ffb_div, see FIG. 1) falls behind the phase of the frequency dividing reference frequency (Fref_div), the state machine outputs the adjusting signal to change the input signal and the working band of the voltage-controlled oscillator 10, so that the feedback signal (Ffb) can continue tracking the reference frequency (Fref) within time period (t2). When the comparator gets the frequency dividing feedback signal (Ffb_div, see FIG. 1) transmitted at faster rate than the frequency dividing reference frequency (Fref_div), and gets the comparing result showing that the phase of the frequency dividing feedback signal (Ffb_div) leads the phase of the frequency dividing reference frequency (Fref_div), the calibration mode is finished and the working band of the voltage-controlled oscillator is locked.

Figure 3:
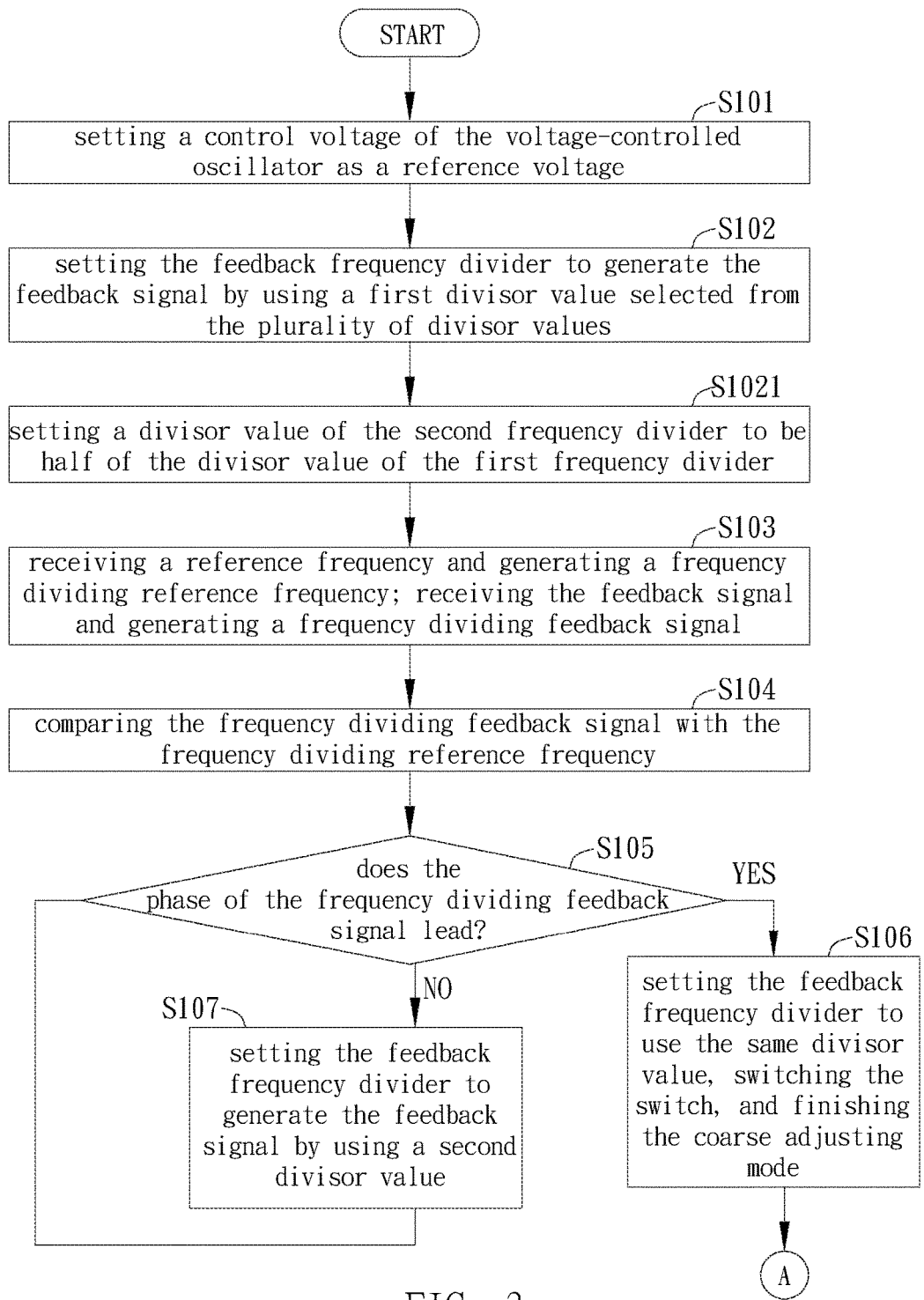
FIG. 3 is a flow chart of the automatic calibration method in a coarse adjusting mode of the present invention.

FIG. 3 is a flow chart of an automatic calibration method in the coarse adjusting mode of the present invention. The automatic calibration method includes the following steps:

S101: setting a control voltage of the voltage-controlled oscillator as a reference voltage;

S102: setting the feedback frequency divider to generate the feedback signal by using a first divisor value selected from the plurality of divisor values;

S103: receiving a reference frequency and generating a frequency dividing reference frequency; receiving the feedback signal and generating a frequency dividing feedback signal;

S104: comparing the frequency dividing feedback signal with the frequency dividing reference frequency;

Step S105: determining whether or not the phase of the frequency dividing feedback signal lead the phase of the frequency dividing reference frequency. The comparator determines the two phases and generates the comparing result.

When the comparing result shows that the phase of the frequency dividing feedback signal leads the phase of the frequency dividing reference frequency, the flow enters S106: setting the feedback frequency divider to use the same divisor value, switching the switch, and finishing the coarse adjusting mode. After the coarse adjusting mode is finished, the switch is connected to the charge pump to turn on the path along the phase frequency detector, the charge pump, and the filter. In contrast, when the comparing result shows that the phase of the frequency dividing feedback signal falls behind the phase of the frequency dividing reference frequency, the flow enters S107: setting the feedback frequency divider to generate the feedback signal by using a second divisor value. In an embodiment, the coarse adjusting mode further includes S1021: setting a divisor value of the second frequency divider to be half of the divisor value of the first frequency divider. In other words, in the coarse adjusting mode, the automatic frequency calibration circuit utilizes the divisor value of the feedback frequency divider and another divisor value smaller than the divisor value used for the reference frequency as the initial locking criteria. The comparator determines whether the comparing result satisfies the initial locking criteria in the coarse adjusting mode in order to decide whether to enter the fine adjusting mode. By this design, the divisor value of the feedback frequency divider can be changed immediately when the phase of the frequency dividing feedback signal falls behind the phase of the frequency dividing reference frequency. As such, the feedback signal can fast track the reference frequency.

Figure 4:
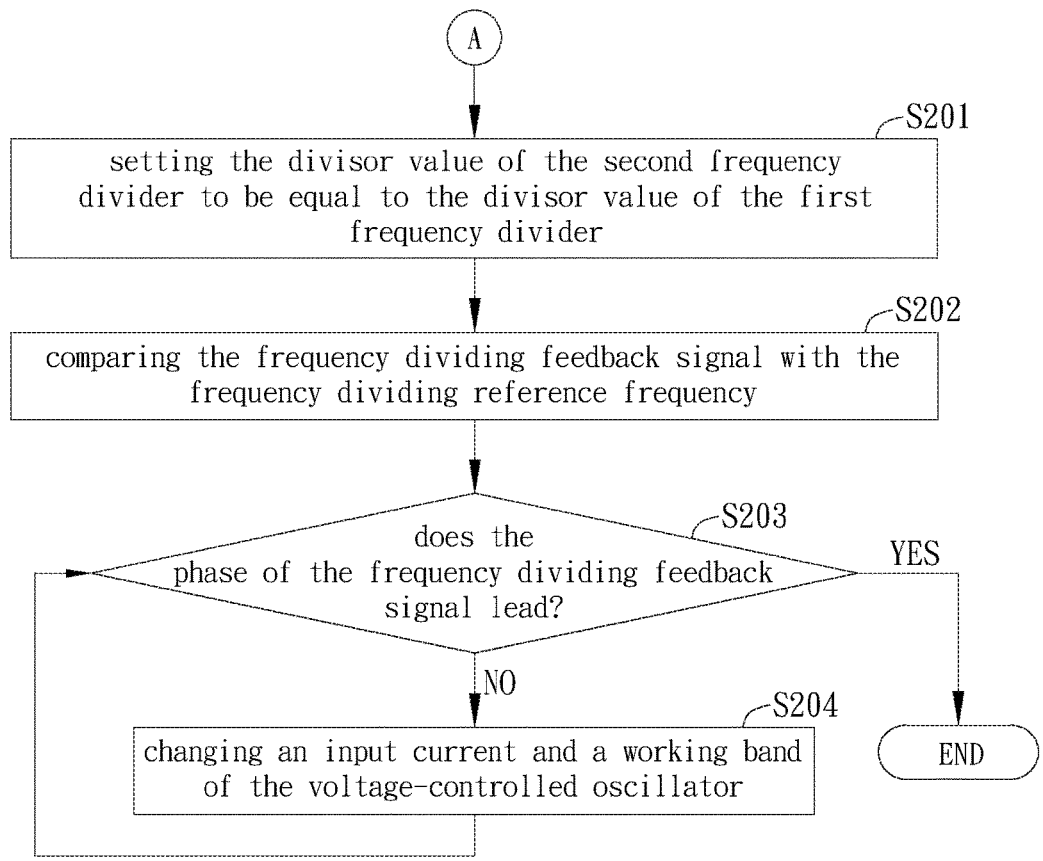
FIG. 4 is a flow chart of the automatic calibration method in a fine adjusting mode of the present invention.

FIG. 4 is a flow chart of the automatic calibration method in the fine adjusting mode of the present invention. After the coarse adjusting mode, the automatic calibration method includes the following steps:

S201: setting the divisor value of the second frequency divider to be equal to the divisor value of the first frequency divider;

S202: comparing the frequency dividing feedback signal with the frequency dividing reference frequency;

S203: determining whether or not the phase of the frequency dividing feedback signal lead the phase of the frequency dividing reference frequency. The comparator determines the two phases and generates the comparing result.

When the comparing result shows that the phase of the frequency dividing feedback signal falls behind the phase of the frequency dividing reference frequency, the flow enters S204: changing the input current and the working band of the voltage-controlled oscillator. In contrast, when the comparing result shows that the phase of the frequency dividing feedback signal leads the phase of the frequency dividing reference frequency, the fine adjusting mode is finished.

In conclusion, comparing to the traditional frequency synthesizing devices, the frequency synthesizing device of the present invention can divide the calibration process into different stages by selecting the divisor value of the feedback frequency divider and changing the relationship between the divisor value of the first frequency divider and the divisor value of the second frequency divider. In the coarse adjusting mode, the feedback signal can fast track the target frequency (reference frequency) by using the feedback frequency divider. In the fine adjusting mode, the working band of the voltage-controlled oscillator can be fine-tuned by changing the input current of the voltage-controlled oscillator. Therefore, the calibration efficiency can be improved. In addition, the criteria, utilized for switching between the coarse adjusting mode and the fine adjusting mode based on the comparison of frequency dividing reference frequency, can simplify the calibration process, avoid complicated algorithm, and consume less system resource.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A frequency synthesizing device, comprising:
   a voltage-controlled oscillator receiving an adjusting signal and generating an output signal according to the adjusting signal;
   a feedback frequency divider having a plurality of divisor values, the feedback frequency divider receiving the output signal and generating a feedback signal after performing frequency dividing; and an automatic frequency calibration circuit comprising:
a first frequency divider receiving a reference frequency and generating a frequency dividing reference frequency;
a second frequency divider receiving the feedback signal and generating a frequency dividing feedback signal;
a comparator receiving and comparing outputs from the first frequency divider and the second frequency divider in a predetermined period to generate a comparing result; and
a state machine outputting the adjusting signal according to the comparing result in a calibration mode;
wherein the calibration mode comprises a coarse adjusting mode; the state machine sets the feedback frequency divider to generate the feedback signal by using a first divisor value selected from the plurality of divisor values in the coarse adjusting mode; when the comparing result shows a phase of the frequency dividing feedback signal falling behind a phase of the frequency dividing reference frequency, the state machine sets the feedback frequency divider to generate the feedback signal by using a second divisor value selected from the plurality of divisor values different from the first divisor value;
wherein the calibration mode further comprises a fine adjusting mode; in the fine adjusting mode, a divisor value of the second frequency divider is set to be equal to the divisor value of the first frequency divider; when the comparing result shows the phase of the frequency dividing feedback signal falling behind the phase of the frequency dividing reference frequency, the state machine outputs the adjusting signal to change an input current and a working band of the voltage-controlled oscillator; when the comparing result shows the phase of the frequency dividing feedback signal leading the phase of the frequency dividing reference frequency, the fine adjusting mode is finished.

2. The frequency synthesizing device of claim 1, wherein in the coarse adjusting mode, when the comparing result shows the phase of the frequency dividing feedback signal leading the phase of the frequency dividing reference frequency, the state machine sets the feedback frequency divider to use the same divisor value and finishes the coarse adjusting mode.

3. The frequency synthesizing device of claim 1, wherein in the coarse adjusting mode, a divisor value of the second frequency divider is set to be half of the divisor value of the first frequency divider.

4. The frequency synthesizing device of claim 1, further comprising a phase frequency detector coupling to the voltage-controlled oscillator via a switch to receive the reference frequency and the feedback signal.

5. The frequency synthesizing device of claim 1, wherein the first divisor value and the second divisor value are integers, and the first divisor value is larger than the second divisor value.

6. An automatic calibration method for a frequency synthesizing device, the frequency synthesizing device comprising a voltage-controlled oscillator, a feedback frequency divider, and an automatic frequency calibration circuit, the feedback frequency divider having a plurality of divisor values, the automatic frequency calibration circuit comprising a first frequency divider and a second frequency divider, the automatic calibration method comprising:
setting a control voltage of the voltage-controlled oscillator as a reference voltage in a coarse adjusting mode;
setting the feedback frequency divider to generate the feedback signal by using a first divisor value selected from the plurality of divisor values;
utilizing the first frequency divider to receive a reference frequency and to generate a frequency dividing reference frequency;
utilizing the second frequency divider to receive the feedback signal and to generate a frequency dividing feedback signal;
comparing the frequency dividing feedback signal with the frequency dividing reference frequency to generate a comparing result;
setting the feedback frequency divider to generate the feedback signal by using a second divisor value selected from the plurality of divisor values different from the first divisor value, when the comparing result shows a phase of the frequency dividing feedback signal falling behind a phase of the frequency dividing reference frequency;
in a fine adjusting mode, setting the divisor value of the second frequency divider to be equal to the divisor value of the first frequency divider;
comparing the frequency dividing feedback signal with the frequency dividing reference frequency to generate the comparing result;
when the comparing result shows the phase of the frequency dividing feedback signal falling behind the phase of the frequency dividing reference frequency, changing an input current and a working band of the voltage-controlled oscillator;
when the comparing result shows the phase of the frequency dividing feedback signal leading the phase of the frequency dividing reference frequency, finishing the fine adjusting mode.

7. The automatic calibration method of claim 6, comprising setting the feedback frequency divider to use the same divisor value and finishes the coarse adjusting mode when the comparing result shows the phase of the frequency dividing feedback signal leading the phase of the frequency dividing reference frequency.

8. The automatic calibration method of claim 6, wherein in the coarse adjusting mode, the method further comprises: setting a divisor value of the second frequency divider to be half of the divisor value of the first frequency divider.

* * * * *